(12) United States Patent
Yamasaki et al.

(10) Patent No.: US 7,394,120 B2
(45) Date of Patent: Jul. 1, 2008

(54) SEMICONDUCTOR DEVICE HAVING A SHAPED GATE ELECTRODE AND METHOD OF MANUFACTURING THE SAME

(75) Inventors: Hiroyuki Yamasaki, Kanagawa (JP); Hitoshi Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/146,029

(22) Filed: Jun. 7, 2005

(65) Prior Publication Data

US 2006/0170006 A1 Aug. 3, 2006

(30) Foreign Application Priority Data

Jan. 28, 2005 (JP) ............................. 2005-021570

(51) Int. Cl.
*H01L 29/78* (2006.01)
(52) U.S. Cl. .............................. 257/288; 257/E21.206; 257/E29.136; 257/410
(58) Field of Classification Search ................ 257/213, 257/E29.169, 288, 618, 327, 410, 412, 377
See application file for complete search history.

(56) References Cited

U.S. PATENT DOCUMENTS 5,729,039 A * 3/1998 Beyer et al. ................. 257/347
5,967,794 A * 10/1999 Kodama ...................... 438/300
6,091,117 A * 7/2000 Shiozawa et al. ............ 257/384
6,144,081 A * 11/2000 Hsu et al. .................... 257/397
6,278,165 B1 * 8/2001 Oowaki et al. .............. 257/410
6,316,808 B1 * 11/2001 Smith, III .................... 257/339
2001/0010383 A1* 8/2001 Son et al. ..................... 257/387
2002/0024107 A1* 2/2002 Inaba .......................... 257/408
2002/0113277 A1* 8/2002 Mehrotra et al. ............ 257/401
2004/0241971 A1* 12/2004 Wieczorek et al. .......... 438/592
2007/0108514 A1* 5/2007 Inoue et al. .................. 257/330

OTHER PUBLICATIONS

Sun, et al., "Impact of Epi Facts on Deep Submicron Elevated Source/Drain MOSFET Characteristics", IEEE Transactions on Electron Devices, vol. 45, No. 6, pp. 1377-1380, (Jun. 1998).

* cited by examiner

*Primary Examiner*—Theresa T. Doan
*Assistant Examiner*—Sarah K Salerno
(74) *Attorney, Agent, or Firm*—Finnegan, Henderson, Farabow, Garrett & Dunner, L.L.P.

(57) ABSTRACT

An MIS transistor includes a gate electrode located to intersect a device region of a semiconductor substrate isolated by a device isolation region, and source and drain regions formed in the semiconductor substrate at both sides of the gate electrode region and elevated source and drain located above the source and drain regions. A gate length of the gate electrode at a boundary between the device isolation region and the device region is longer than the gate length at a central portion of the device region.

12 Claims, 7 Drawing Sheets

SEMICONDUCTOR DEVICE HAVING A SHAPED GATE ELECTRODE AND METHOD OF MANUFACTURING THE SAME

CROSS-REFERENCE TO RELATED APPLICATION

This application is based upon and claims the benefit of priority from prior Japanese Patent Application No. 2005-21570 filed on Jan. 28, 2005 in Japan, the entire contents of which are incorporated herein by reference.

BACKGROUND OF THE INVENTION

1. Field of the Invention

The present invention relates to a semiconductor device including an MIS (metal-insulator-semiconductor) transistor and a method of manufacturing the same.

2. Background Art

Generally, in an MIS transistor including a gate sidewall, the salicide junction leak margin is degraded due to a shallower junction of a source and drain layer. In order to prevent this, an elevated source and drain structure, in which source and drain regions are elevated above a silicon substrate using selective epitaxial growth.

However, since an MIS transistor is isolated using the STI (Shallow Trench Isolation) method, a facet is formed at the boundary between an STI (Shallow Trench Insulator) and an elevated source or drain. Because of such facets, the source and drain regions are partially deepened, resulting in that the aspect ratio between the gate length and the depth of the source and drain regions (junction depth) is smaller in a region under a facet 15a than that in the other regions in the device region. Accordingly, there is a problem in that the short channel effect of the MIS transistor is degraded further (Jie. J. Sun et al., "Impact of Epi Facets on Deep Submicron Elevated Source/Drain MOSFET Characteristics", IEEE TRANSACTIONS ON ELECTRON DEVICES, VOL. 45, No. 6, June 1998).

SUMMARY OF THE INVENTION

A semiconductor device according to a first aspect of the present invention includes:

an MIS transistor including a gate electrode located to intersect a device region of a semiconductor substrate isolated by a device isolation region; and source and drain regions provided in the semiconductor substrate at both sides of the gate electrode and elevated source and drain located above the source and drain regions, a gate length of the gate electrode at a boundary between the device isolation region and the device region being longer than the gate length thereof at a central portion of the device region.

A method of manufacturing a semiconductor device according to a second aspect of the present invention includes:

sequentially forming a gate dielectric film material layer and a gate electrode material layer on a device region of a semiconductor substrate, the device region being isolated by a device isolation region of an insulating material; and sequentially patterning the gate electrode material layer and the gate dielectric film material layer, thereby forming a gate electrode and a gate dielectric film, in which a gate length near a boundary between the device isolation region and the device region is wider than the gate length at a central portion of the device region.

DESCRIPTION OF THE EMBODIMENTS

An embodiment of the present invention will be described below with reference to the accompanying drawings.

Figure 1:
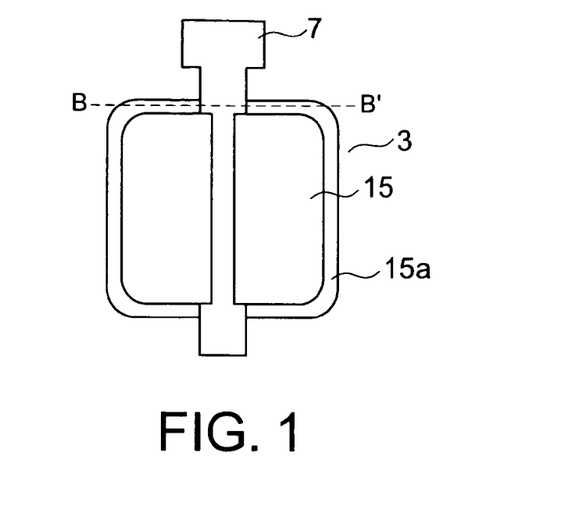
FIG. 1 is a plan view showing the structure of a semiconductor device according to an embodiment of the present invention.
Figure 2:
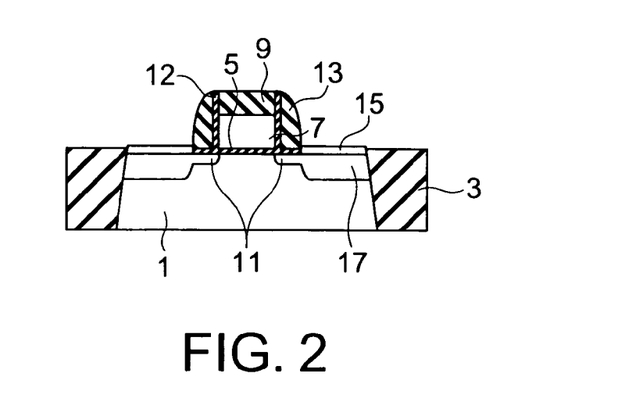
FIG. 2 is a sectional view taken along line B-B' of FIG. 1.

FIG. 1 shows the structure of a semiconductor device according to an embodiment of the present invention. The semiconductor device of this embodiment includes an MIS transistor having elevated source and drain. FIG. 1 shows the plan view of the semiconductor device, and FIG. 2 shows a sectional view taken along line B-B' of FIG. 1.

The semiconductor device of this embodiment includes an MIS transistor, which is formed in a device isolation region of a semiconductor substrate 1 isolated by STIs (Shallow Trench Insulators) 3 and has a gate dielectric film 5, a gate electrode 7 formed on the gate dielectric film 5, gate sidewalls 12 and 13 of an insulating material formed at side portions of the gate electrode 7, an extension layer 11 formed in the semiconductor substrate 1 at both sides of the gate electrode 7, source and drain regions 17 provided in the semiconductor substrate 1 at both sides of the gate electrode 7, the junction depth of the source and drain regions 17 being deeper and the impurity concentration thereof being higher than those of the extension layer 11, and elevated source and drain 15 formed above the source and drain region 17. The upper surface of the gate electrode 7 is covered by an insulating film 9. The gate sidewall 12 is formed of, e.g., thin TEOS (Tetra-Ethyl-Ortho-Silicate), and the gate sidewall 13 and the insulating film 9 are formed of, e.g., SiN.

Since the MIS transistor according to this embodiment includes the elevated source and drain 15 formed by selective epitaxial growth, a facet 15a is formed in the elevated source or drain 15 at the boundary between the elevated source or drain 15 and the STI 3. Accordingly, the junction depth of the source and drain region 17 below the region where a facet 15a is formed becomes deeper than that of the region around the center of the device region.

However, in this embodiment, as shown in FIG. 1, the gate length of the gate electrode 7 near the boundary between the elevated source and drain 15 and the STI 3 is designed to be longer than the gate length of the gate electrode 7 at the central portion of the device region. Accordingly, the aspect ratio between the gate length and the depth (junction depth) of the source and drain regions becomes greater in the region where the facet 15a is formed as compared to the conventional cases, thereby preventing the degradation of the short channel effect.

Figure 3:
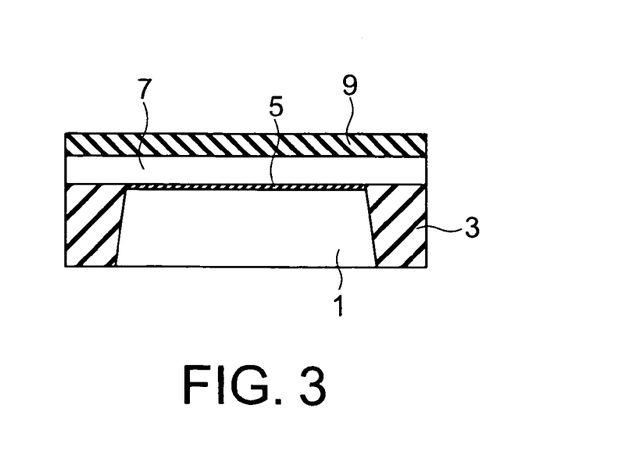
FIG. 3 is a sectional view showing a step in a process of manufacturing a semiconductor device according to an embodiment of the present invention.

Next, the process of manufacturing a semiconductor device according to this embodiment will be described with reference to FIGS. 3 to 18. First, as shown in FIG. 3, a gate dielectric film 5 is formed on the device region of a semiconductor substrate 1 isolated by STIs 3. Thereafter, a gate electrode film 7 and an SiN film 9 are sequentially formed so as to cover the gate dielectric film 5.

Figure 4:
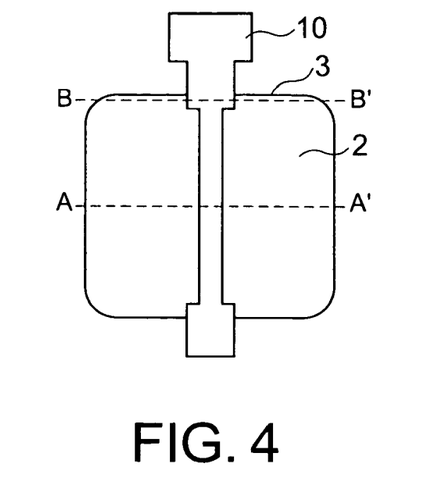
FIG. 4 is a plan view showing a step in the process of manufacturing a semiconductor device according to the embodiment of the present invention.
Figure 5:
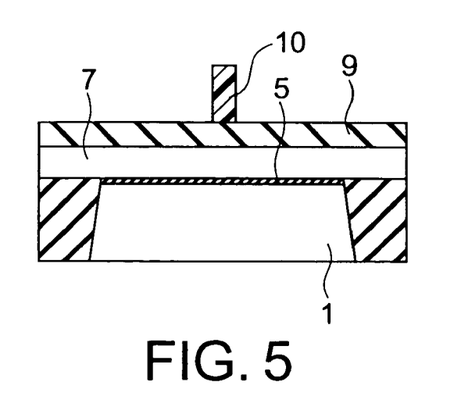
FIG. 5 is a sectional view taken along line A-A' of FIG. 4.
Figure 6:
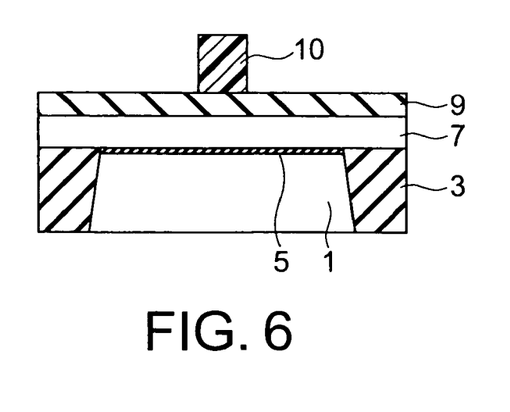
FIG. 6 is a sectional view taken along line B-B' of FIG. 4.

Subsequently, as shown in FIGS. 4, 5, and 6, a resist pattern 10 is formed of a photoresist on the SiN film 9. FIG. 4 is a plan view, FIG. 5 is a sectional view taken along line A-A' of FIG. 4, and FIG. 6 is a sectional view taken along line B-B' of FIG. 4. The width of the resist pattern 10 is designed to be wider near the boundary between the device region 2 and the STI 3 than the width thereof at the central portion of the device region. That is to say, the width of the resist pattern 10 shown in FIG. 6 is wider that the width of the resist pattern 10 shown in FIG. 4.

Figure 7:
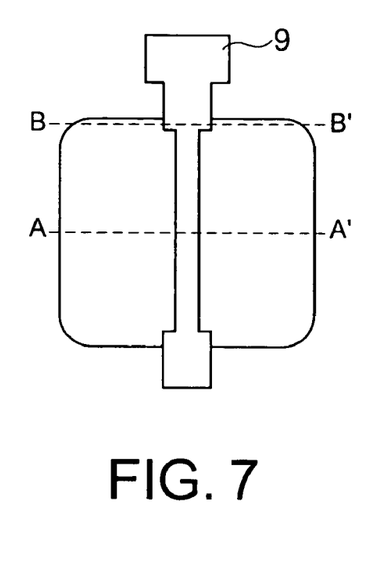
FIG. 7 is a plan view showing a step in the process of manufacturing a semiconductor device according to the embodiment of the present invention.
Figure 8:
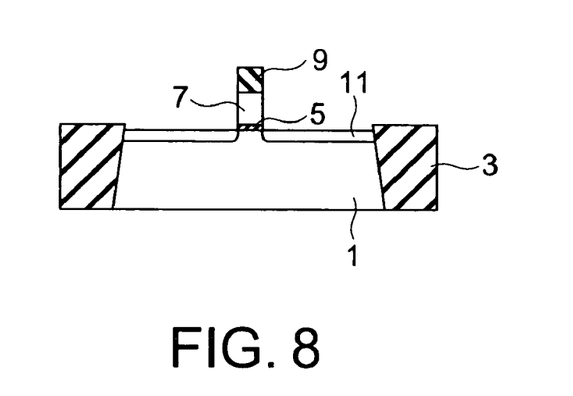
FIG. 8 is a sectional view taken along line A-A' of FIG. 7.
Figure 9:
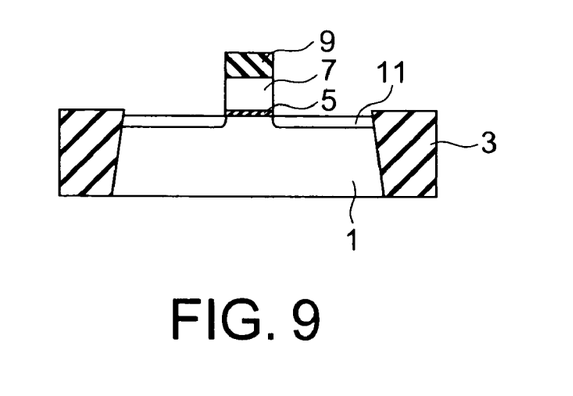
FIG. 9 is a sectional view taken along line B-B' of FIG. 7.

Next, the SiN film 9, the gate electrode film 7, and the gate electrode 5 are patterned using the resist pattern 10 as a mask, thereby forming a gate electrode 7. Thereafter, the resist pattern 10 is removed (FIGS. 7, 8, and 9). FIG. 7 is a plan view, FIG. 8 is a sectional view taken along line A-A' of FIG. 7, and FIG. 9 is a sectional view taken along line B-B' of FIG. 7. Subsequently, impurity ions are implanted to form an extension layer 11, which has a deep junction depth and low impurity concentration. Conditions of the ion implantation to form the extension layer 11 in the case where the extension layer 11 is in an n-type region are the acceleration voltage of 1 KeV and the dose amount of $8 \times 10^{14}$ cm$^{-2}$ using As ions, for example, and in the case where the extension layer 11 is in a p-type region are the acceleration voltage of 1.5 KeV and the dose amount of $1.5 \times 10^{15}$ cm$^{-2}$ using BF2 ions, for example. An offset spacer can be formed before the formation of the extension layer. After an impurity is implanted into the extension layer 11, annealing is performed to activate the impurity implanted into the extension layer 11.

Figure 10:
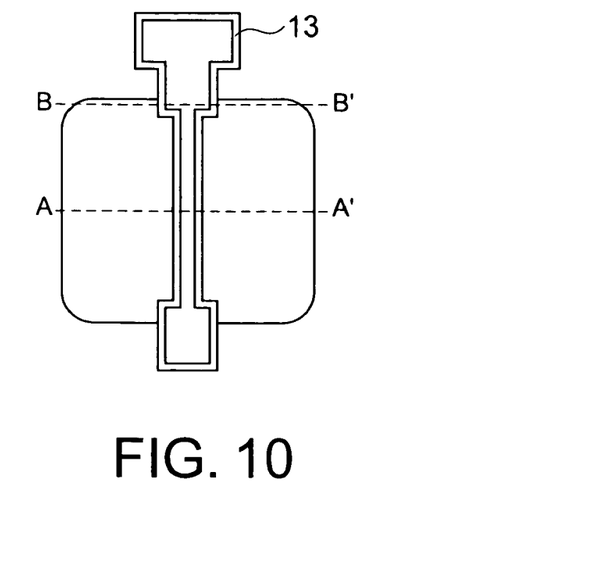
FIG. 10 is a plan view showing a step in the process of manufacturing a semiconductor device according to the embodiment of the present invention.
Figure 11:
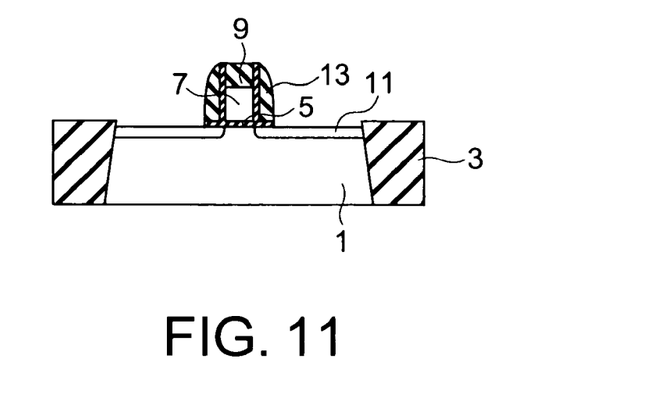
FIG. 11 is a sectional view taken along line A-A' of FIG. 10.
Figure 12:
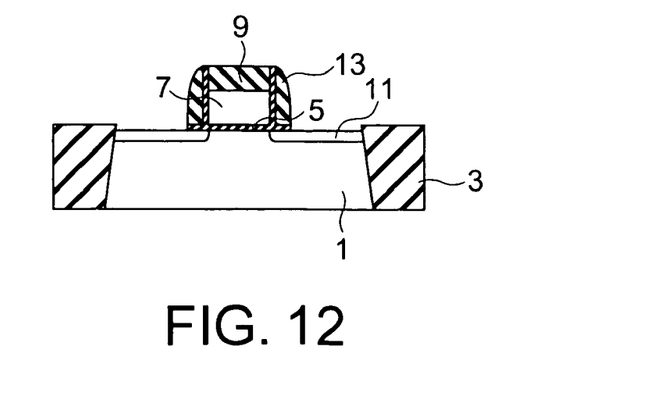
FIG. 12 is a sectional view taken along line B-B' of FIG. 10.

Next, a TEOS film 12 and an SiN film 13 are deposited on the entire surface of the workpiece, and anisotropy etching (for example, RIE (Reactive Ion Etching)) is performed, thereby forming gate sidewalls composed of the TEOS film 12 and the SiN film 13 at the side portions of the gate electrode 7 as shown in FIGS. 10, 11, and 12. FIG. 10 is a plan view, FIG. 11 is a sectional view taken along line A-A' of FIG. 10, and FIG. 12 is a sectional view taken along line B-B' of FIG. 10.

Figure 13:
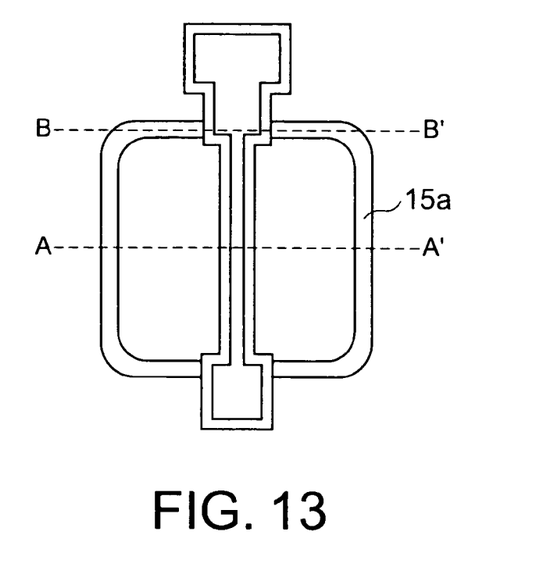
FIG. 13 is a plan view showing a step in the process of manufacturing a semiconductor device according to the embodiment of the present invention.
Figure 14:
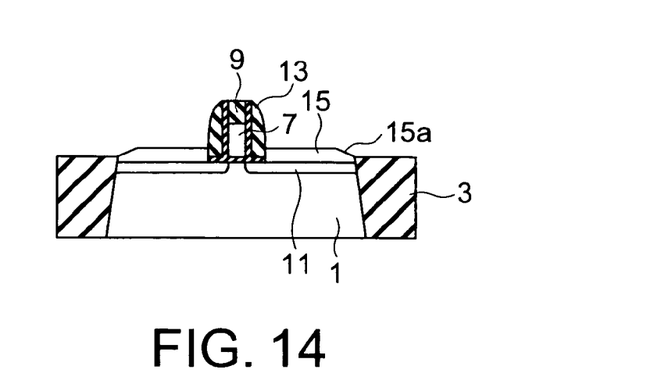
FIG. 14 is a sectional view taken along line A-A' of FIG. 13.
Figure 15:
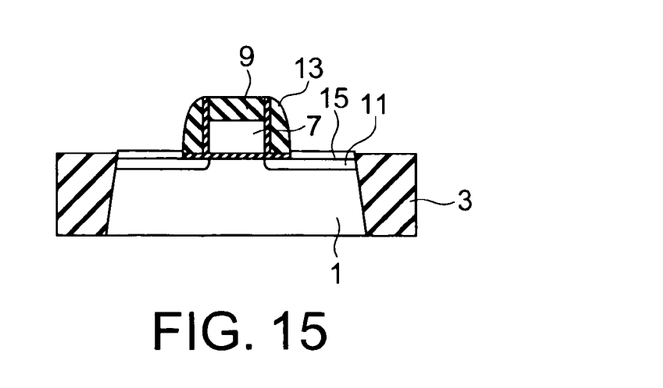
FIG. 15 is a sectional view taken along line B-B' of FIG. 13.

Then, as shown in FIGS. 13, 14, and 15, an epitaxial silicon layer is formed on the semiconductor substrate 1 by selective epitaxial growth. FIG. 13 is a plan view, FIG. 14 is a sectional view taken along line A-A' of FIG. 13, and FIG. 15 is a sectional view taken along line B-B' of FIG. 13. The selective epitaxial growth of silicon is performed with the selectivity with respect to the SiN film 9 on the gate electrode 7, the SiN film 13 of the gate sidewall, and the STI 3 being maintained. At this time, since the STI 3 is formed of an oxide film, a facet 15a is formed in the epitaxial silicon layer 15 along the edge of the STI 3 (FIG. 14).

Figure 16:
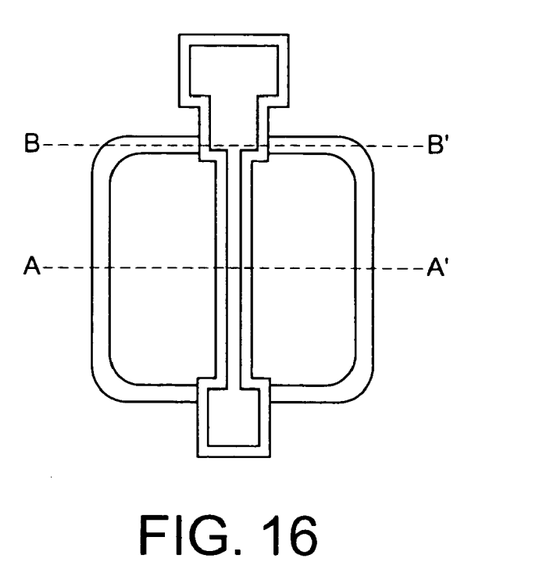
FIG. 16 is a plan view showing a step in the process of manufacturing a semiconductor device according to the embodiment of the present invention.
Figure 17:
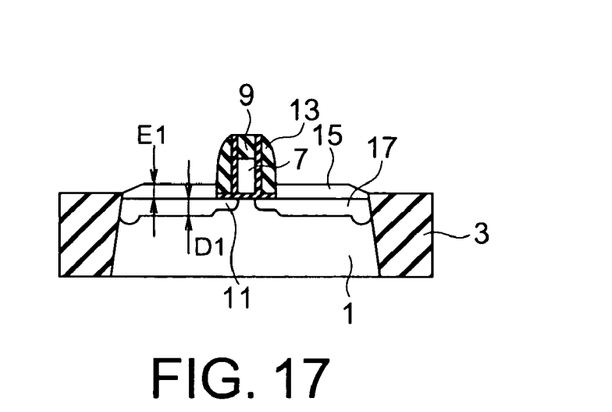
FIG. 17 is a sectional view taken along line A-A' of FIG. 16.
Figure 18:
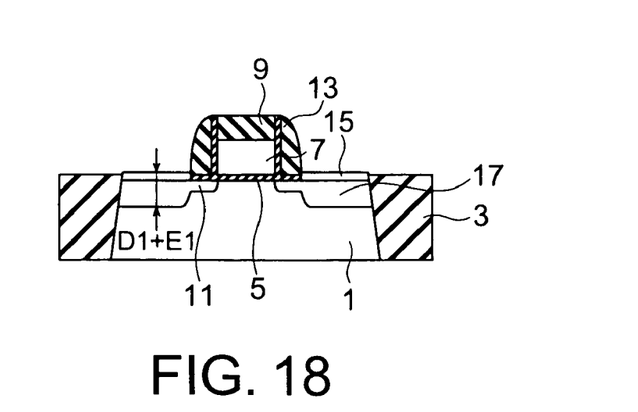
FIG. 18 is a sectional view taken along line B-B' of FIG. 16.

Thereafter, ion implantation and activation annealing are performed to form source and drain regions 17 (FIGS. 16, 17, and 18). Conditions of the ion implantation to form the source and drain regions 17 in the case where the source and drain regions 17 are in the n-type region are the acceleration voltage of 5 KeV and the dose amount of $1 \times 10^{15}$ cm$^{-2}$ using P ions, for example, and in the case where the source and drain regions 17 are in the p-type region are the acceleration voltage of 2 KeV and the dose amount of $4 \times 10^{15}$ cm$^{-2}$ using B ions, for example. At this time, the epitaxial silicon layer 15 becomes elevated source and drain. FIG. 16 is a plan view, FIG. 17 is a sectional view taken along line A-A' of FIG. 16, and FIG. 18 is a sectional view taken along line B-B' of FIG. 16.

As shown in FIGS. 17 and 18, assuming that the junction depth of the portion where the facet 15a is not formed is D1, and the length of the surface of silicon substrate 1 elevated by the elevated source and drain 11 is E1, the junction depth of the region where the facet 15a is formed is D1+E1. The elevated length E1 should be set at a value sufficient enough to curb the junction leakage of salicide, i.e., about 20 nm to 30 nm. In the region where the facet 15a is formed, the junction depth of the source and drain 17 is deeper than that in the central portion of the device region. Accordingly, the short channel effect is degraded further.

In order to curb the degradation of the short channel effect, the aspect ratio between the gate length and the junction depth of the source and drain regions in the region where the facet is formed should be made substantially the same as that in the region where the facet is not formed. That is to say, the gate length at the boundary between the device isolation region 3 and the device region should be about (D1+E1)/D1 of the gate length at the central portion of the device region.

Specifically, the elevated length E1 of the silicon substrate 1 caused by the elevated source and drain is set to be 20 nm to 30 nm, and the junction depth D1 of the region where the facet 15a is not formed is set to be 80 nm. As a result, the gate length at the boundary between the device isolation region and the device region becomes (D1+E1)/D1 of the gate length at the central portion of the device region, i.e., from (80+20)/80=1.25 to (80+30)/80=1.375 times the gate length at the central portion of the device region. When the junction depth in the region where the facet 15a is not formed is 60 nm, the gate length becomes from (60+20)/60=1.33 to (60+30)/60=1.5 times the gate length at the central portion of the device region.

That is to say, it is preferable that the gate length at the boundary between the device isolation region and the device region be 1.25 to 1.5 times, and more preferably 1.25 to 1.375 times, the gate length at the central portion of the device region.

Generally, the gate length L can be obtained by the following equation (1) where Tox is the gate dielectric film thickness, Wdm is the depletion layer width, $\psi$bi is the internal potential, and Vds is the power supply voltage. Using this equation (1), it is possible to estimate the degree the gate length L should be increased.

$$L = \frac{Wdm}{12\pi Tox(Wdm + 3Tox)\sqrt{\Psi bi(\Psi bi + Vds)}} \quad (1)$$

Figure 19:
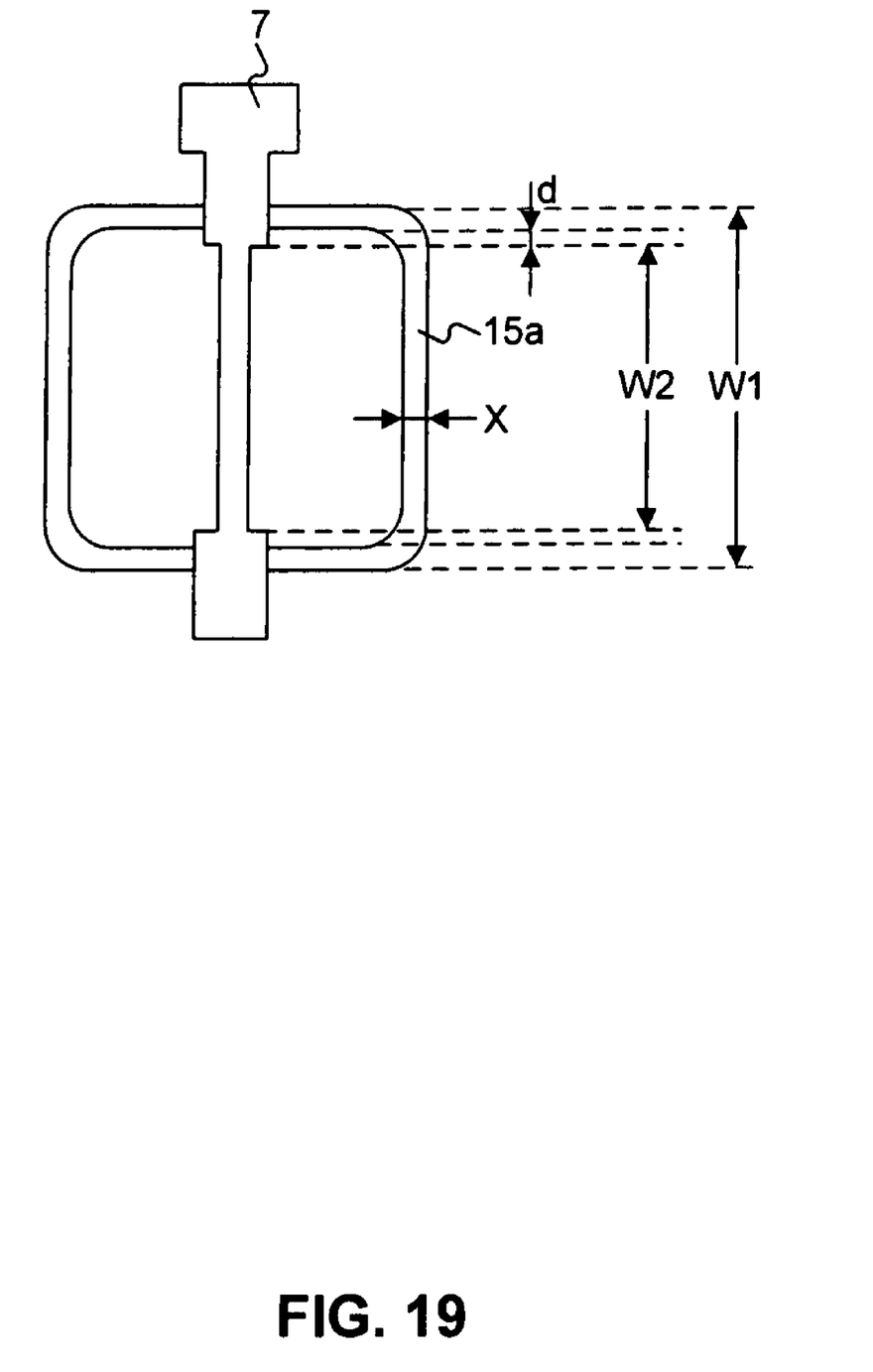
FIG. 19 explains the estimation of matching margin of the gate electrode of the semiconductor device according to an embodiment of the present invention.

Assuming that the length of the facet 15a is X, and the lithography matching margin of the gate electrode is d, the minimum length for covering the facet 15a at the edge portion of the STI 3 with the wide gate electrode 7 is X+d. Assuming that W1 is a width of the gate electrode 7 in the source and drain regions, and W2 is the length of the narrow portion of the gate electrode 7, the relationship therebetween can be represented by the following equation (2) (FIG. 19).

$$W2 \leq W1 - 2(X+d) \quad (2)$$

As described above, according to this embodiment, it is possible to prevent the degradation of short channel effect caused by a facet formed at an edge portion of an STI, thereby preventing the degradation of the characteristics of an MIS transistor.

Although the semiconductor substrate 1 is a bulk silicon substrate in the aforementioned embodiment, an SOI substrate can also be used. When an SOI substrate is used, the formation of the elevated layer is important to prevent the silicon layer on the insulating film from entirely becoming silicide in a step of forming salicide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A semiconductor device comprising:
an MIS transistor including a gate electrode located to intersect a device region of a semiconductor substrate isolated by a device isolation region; source and drain regions provided in the semiconductor substrate at both sides of the gate electrode; and elevated source and drain located above the source and drain regions, the elevated source and drain having a facet along an edge of the device isolation region, and the gate electrode having a first portion located in a device region and a second portion located at a boundary between the device isolation region and the device region,
a gate length of the second portion being about (D1+E1)/D1 of the gate length of the first portion, D1 being a junction depth of the source and drain where the facet is not formed, and E1 being a length from an upper face of the elevated source and drain to a surface of the semiconductor substrate where the facet is not formed.

2. The semiconductor device according to claim 1, wherein the elevated source and drain are epitaxially grown films.

3. The semiconductor device according to claim 1, wherein the elevated source and drain each have a facet at a boundary between the device isolation region and the device region, and a portion of the gates electrode, of which the gate length is adjusted to be longer, is located above the facet.

4. The semiconductor device according to claim 1, wherein the gate length at the boundary between the device isolation region and the device region is from 1.25 to 1.5 times the gate length at the central portion of the device region.

5. The semiconductor device according to claim 4, wherein the gate length at the boundary between the device isolation region and the device region is from 1.25 to 1.3 times the gate length at the central portion of the device region.

6. The semiconductor device according to claim 1, wherein the gate electrode and the elevated source and drain are electrically insulated by gate sidewalls of an insulating material provided at side portions of the gate electrode.

7. The semiconductor device according to claim 6, wherein the elevated source and drain are epitaxially grown films.

8. The semiconductor device according to claim 6, wherein the elevated source and drain each have a facet at a boundary between the device isolation region and the device region, and a portion of the gate electrode, of which the gate length is adjusted to be longer, is located above the facet.

9. The semiconductor device according to claim 6, wherein the gate length at the boundary between the device isolation region and the device region is from 1.25 to 1.5 times the gate length at the central portion of the device region.

10. The semiconductor device according to claim 9, wherein the gate length at the boundary between the device isolation region and the device region is from 1.25 to 1.3 times the gate length at the central portion of the device region.

11. The semiconductor device according to claim 6, further comprising an extension layer which is provided in the semiconductor substrate between a channel region located in the semiconductor substrate under the gate electrode and the source and drain regions, has a junction depth shallower than the source and drain regions, and has an impurity concentration lower than the source and drain regions.

12. The semiconductor device according to claim 1, wherein a gate width W2 of the first portion of the gate electrode satisfies the following relationship:

$$W2 \leq W1 - 2(X+d)$$

where W1 is a gate width of the gate electrode, X is a length of the facet, and D is a length between a joint surface of the first and second portions of the gate electrode and the facet.

* * * * *